United States Patent
Mayberry et al.

(10) Patent No.: US 10,617,035 B2
(45) Date of Patent: Apr. 7, 2020

(54) ADDITIVELY MANUFACTURED STRUCTURES FOR GRADIENT THERMAL CONDUCTIVITY

(71) Applicant: Raytheon Company, Waltham, MA (US)

(72) Inventors: Travis L. Mayberry, McKinney, TX (US); Michael J. Arthur, Indianapolis, IN (US); James A. Pruett, Allen, TX (US)

(73) Assignee: Raytheon Company, Waltham, MA (US)

( * ) Notice: Subject to any disclaimer, the term of this patent is extended or adjusted under 35 U.S.C. 154(b) by 56 days.

(21) Appl. No.: 15/991,522

(22) Filed: May 29, 2018

(65) Prior Publication Data

US 2019/0373772 A1    Dec. 5, 2019

(51) Int. Cl.
| | |
|---|---|
| *F28F 13/00* | (2006.01) |
| *H05K 7/20* | (2006.01) |
| *B33Y 80/00* | (2015.01) |
| *B22F 3/105* | (2006.01) |
| *B22F 5/00* | (2006.01) |

(52) U.S. Cl.
CPC ......... *H05K 7/20409* (2013.01); *B22F 3/105* (2013.01); *B22F 5/00* (2013.01); *B33Y 80/00* (2014.12); *B22F 2999/00* (2013.01)

(58) Field of Classification Search
CPC ..... H02K 5/18; F28F 3/02; F28F 3/04; H05K 7/20918; H05K 7/20409; F28D 1/0452; B33Y 80/00; B22F 3/105; B22F 5/00; B22F 2999/00

USPC ......................................................... 165/146
See application file for complete search history.

(56) References Cited

U.S. PATENT DOCUMENTS

| | | | |
|---|---|---|---|
| 6,862,183 B2* | 3/2005 | Chrysler | F28F 3/02 165/185 |
| 2003/0178181 A1 | 9/2003 | Noda et al. | |
| 2005/0045308 A1 | 3/2005 | Wang et al. | |
| 2005/0269062 A1* | 12/2005 | Guerrero | F28D 1/0452 165/101 |
| 2008/0180914 A1 | 7/2008 | Khanna | |
| 2014/0311725 A1* | 10/2014 | Balasubramanian | F28F 3/04 165/168 |
| 2015/0137412 A1 | 5/2015 | Schalansky | |
| 2015/0145356 A1* | 5/2015 | Soulier | H02K 5/18 310/54 |

(Continued)

*Primary Examiner* — Davis D Hwu
(74) *Attorney, Agent, or Firm* — Renner, Otto, Boisselle & Sklar, LLP

(57) ABSTRACT

A manifold structure is provided to cool a heat-dissipating surface and includes an inlet fluid passage, an outlet fluid passage, and at least one cooling channel that is connected between the inlet fluid passage and the outlet fluid passage and extends along a length of the heat-dissipating surface. Additively manufactured fins are arranged in the cooling channel. The fins are configured to provide a geometry transition area between fins having a first geometry and fins having a second geometry, and a material transition area between fins formed of a first material and fins formed of a second material. The manifold structure is configured to provide a gradient convection coefficient by way of the geometry transition area and a gradient thermal conductivity by way of the material transition area across the length of the heat-dissipating surface.

20 Claims, 5 Drawing Sheets

(56) References Cited

U.S. PATENT DOCUMENTS

2016/0230595 A1    8/2016  Wong et al.
2016/0234967 A1*  8/2016  Choi ................. H05K 7/20918
2017/0198988 A1    7/2017  Herring

* cited by examiner

ADDITIVELY MANUFACTURED STRUCTURES FOR GRADIENT THERMAL CONDUCTIVITY

FIELD OF THE INVENTION

The invention relates to cooling manifold structures for heat-dissipating surfaces.

DESCRIPTION OF THE RELATED ART

Many applications use radiating elements that require cooling. For example, hypersonic vehicles have radar systems, laser systems, and other electronic systems that use radiating elements. The radiating elements may have a high change in temperature, or thermal gradient, between the elements. When the radiating elements have a high thermal gradient between the elements, unintentional beam steering may occur such that the performance of the radar (or other electronic device) may diminish, and calibration of the electronic devices may become difficult.

Prior attempts have been made to reduce the temperature gradient across a radar, such as using various methods for tuning the fluid mass flow rate to each radiating element. However, the previously attempted tuning methods are complex since varying coolant flow must be provided to each radiating element in the radar.

SUMMARY OF THE INVENTION

Additive manufacturing (AM) is advantageous in forming a manifold structure, such as a heat exchangers or cold plate. A finned heat exchanger provides for more efficient heat transfer along the length of a heat-dissipating surface. Using AM to form fins within the manifold structure enables the fins to have more complex geometries and material properties. The additively manufactured fins may have varying geometries and material properties along the length of a cooling channel within the manifold structure. The fins may have a gradual geometry transition area for providing a gradient convection coefficient along the length of the heat-dissipating surface. The fins may also have a gradual material transition area for providing a gradient thermal conductivity along the length of the heat-dissipating surface. Providing both a gradient convection coefficient and a gradient thermal conductivity generates a low temperature rise in the electronics and a substantially linear heat transfer rate along the length of the cooling channel and along the length of the heat-dissipating surface, such as in a radar.

According to an aspect of the invention, a manifold structure for cooling a heat-dissipating surface includes an inlet fluid passage, an outlet fluid passage, at least one cooling channel that is connected between the inlet fluid passage and the outlet fluid passage and extends along a length of the heat-dissipating surface, and a plurality of fins that is arranged within the at least one cooling channel. The plurality of fins includes at least one of a geometry transition area in which the plurality of fins gradually transitions from a first geometry to a second geometry, or a material transition area in which the plurality of fins gradually transitions from a first material to a second material. The plurality of fins is configured to provide at least one of a gradient convection coefficient or a gradient thermal conductivity across the length of the heat-dissipating surface.

According to an embodiment of any paragraph(s) of this summary, the plurality of fins includes a first set of fins arranged proximate the inlet fluid passage, a second set of fins arranged proximate the outlet fluid passage, and a third set of fins arranged between the first set of fins and the second set of fins. The first set of fins includes fins having the first geometry and the second set of fins includes fins having the second geometry. The third set of fins includes fins having non-uniform and varying geometries relative to each other. The third set of fins is configured to provide the geometry transition area, whereby the plurality of fins is configured to provide the gradient convection coefficient across the length of the heat-dissipating surface.

According to an embodiment of any paragraph(s) of this summary, a spacing between each of the plurality of fins gradually decreases along the length of the heat-dissipating surface from the inlet fluid passage to the outlet fluid passage, whereby a density of the plurality of fins gradually increases.

According to an embodiment of any paragraph(s) of this summary, the spacing decreases at a constant and linear rate.

According to an embodiment of any paragraph(s) of this summary, the plurality of fins gradually increases or decreases in size along the length of the heat-dissipating surface.

According to an embodiment of any paragraph(s) of this summary, each of the plurality of fins is pin-shaped.

According to an embodiment of any paragraph(s) of this summary, the plurality of fins has diameters that increase or decrease along the length of the heat-dissipating surface.

According to an embodiment of any paragraph(s) of this summary, the plurality of fins includes a first set of fins that is arranged proximate the inlet fluid passage and formed of a first material, a second set of fins that is arranged proximate the outlet fluid passage and formed of a second material, and a third set of fins that is arranged between the first set of fins and the second set of fins and is formed of non-uniform materials. The third set of fins is configured to provide the material transition area, whereby the plurality of fins is configured to provide the gradient thermal conductivity across the length of the heat-dissipating surface.

According to an embodiment of any paragraph(s) of this summary, the first set of fins is formed of a first metal material and the second set of fins is formed of a second metal material.

According to an embodiment of any paragraph(s) of this summary, one of the first metal material and the second metal material is aluminum, the other of the first metal material and the second metal material is copper, and the third set of fins is formed of alloys of copper and aluminum.

According to an embodiment of any paragraph(s) of this summary, at least one of the first set of fins and the second set of fins is formed of a non-conductive metal or non-conductive fiber.

According to an embodiment of any paragraph(s) of this summary, the manifold structure is a heat exchanger or a cold plate.

According to yet another aspect of the invention, a manifold structure for cooling a heat-dissipating surface includes an inlet fluid passage, an outlet fluid passage, at least one cooling channel that is connected between the inlet fluid passage and the outlet fluid passage and extends along a length of the heat-dissipating surface, a first set of fins that is arranged proximate the inlet fluid passage within the at least one cooling channel, the first set of fins having a first predetermined geometry and being formed of a first predetermined material, a second set of fins that is arranged proximate the outlet fluid passage within the at least one cooling channel, the second set of fins having a second predetermined geometry and being formed of a second predetermined material, and a third set of fins that is arranged between the first set of fins and the second set of fins. The third set of fins has a non-uniform geometry for providing a geometry transition area from the first set of fins to the second set of fins. The third set of fins is formed of a non-uniform material for providing a material transition area from the first set of fins to the second set of fins. The manifold structure is configured to provide a gradient convection coefficient by way of the geometry transition area and a gradient thermal conductivity by way of the material transition area across the length of the heat-dissipating surface.

According to an embodiment of any paragraph(s) of this summary, the plurality of fins gradually increases or decreases in size along the length of the heat-dissipating surface.

According to an embodiment of any paragraph(s) of this summary, the plurality of fins is arranged in an ordered arrangement.

According to an embodiment of any paragraph(s) of this summary, a spacing between each of the plurality of fins gradually decreases along the length of the heat-dissipating surface from the inlet fluid passage to the outlet fluid passage, whereby a density of the plurality of fins gradually increases.

According to an embodiment of any paragraph(s) of this summary, one of the first metal material and the second metal material is aluminum, the other of the first metal material and the second metal material is copper, and the third set of fins is formed of alloys of copper and aluminum.

According to an embodiment of any paragraph(s) of this summary, at least one of the first set of fins and the second set of fins is formed of a non-conductive metal or fiber.

According to an embodiment of any paragraph(s) of this summary, the manifold structure is a heat exchanger or a cold plate.

According to still another aspect of the invention, a method of forming a manifold structure for cooling a heat-dissipating surface includes forming an inlet fluid passage, an outlet fluid passage, and at least one cooling channel that is connected between the inlet fluid passage and the outlet fluid passage, arranging the at least one cooling channel to extend along a length of the heat-dissipating surface, and forming a plurality of fins in the at least one cooling channel using an additive manufacturing process. Forming the plurality of fins includes forming fins having at least one of different geometries or different material properties to provide at least one of a gradient convection coefficient and a gradient thermal conductivity across the length of the heat-dissipating surface.

According to an embodiment of any paragraph(s) of this summary, forming the plurality of fins includes using a laser powder bed fusion process or a direct energy deposition process.

According to an embodiment of any paragraph(s) of this summary, forming the plurality of fins includes forming a first set of fins arranged proximate the inlet fluid passage and including fins having a first geometry, forming a second set of fins arranged proximate the outlet fluid passage and including fins having a second geometry, and forming a third set of fins between the first set of fins and the second set of fins. The third set of fins include fins having non-uniform and varying geometries relative to each other. The third set of fins is configured to provide a gradual geometry transition between the first set of fins and the second set of fins.

According to an embodiment of any paragraph(s) of this summary, forming the plurality of fins includes forming the plurality of fins to have uniform or non-uniform shapes.

According to an embodiment of any paragraph(s) of this summary, forming the plurality of fins includes forming the plurality of fins in an ordered arrangement.

According to an embodiment of any paragraph(s) of this summary, forming the plurality of fins includes gradually decreasing the spacing between each of the plurality of fins along the length of the heat-dissipating surface from the inlet fluid passage to the outlet fluid passage.

According to an embodiment of any paragraph(s) of this summary, forming the plurality of fins includes forming a first set of fins that are proximate the inlet fluid passage and formed of a first material, forming a second set of fins that are proximate the outlet fluid passage and formed of a second material, and forming a third set of fins that are arranged between the first set of fins and the second set of fins and are formed of non-uniform materials. The third set of fins is configured to provide a gradual material transition between the first set of fins and the second set of fins, whereby the plurality of fins is configured to provide the gradient thermal conductivity across the length of the heat-dissipating surface.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

The principles described herein have particular application in a manifold structure that may be used for heating or cooling a heat-dissipating surface to which the manifold structure is attached. The manifold structure may be a heat exchanger. The manifold structure may include cold plates. Cold plates may be used in various applications, such as in military electronics packaging or in any suitable aerospace application for cooling electronics, for instance in a laser system or radar system. For example, cold plates may be implemented in radar structures. The manifold structure described herein may be implemented in many other applications. For example, the manifold structure may be used in directed energy weapons.

Figure 1:
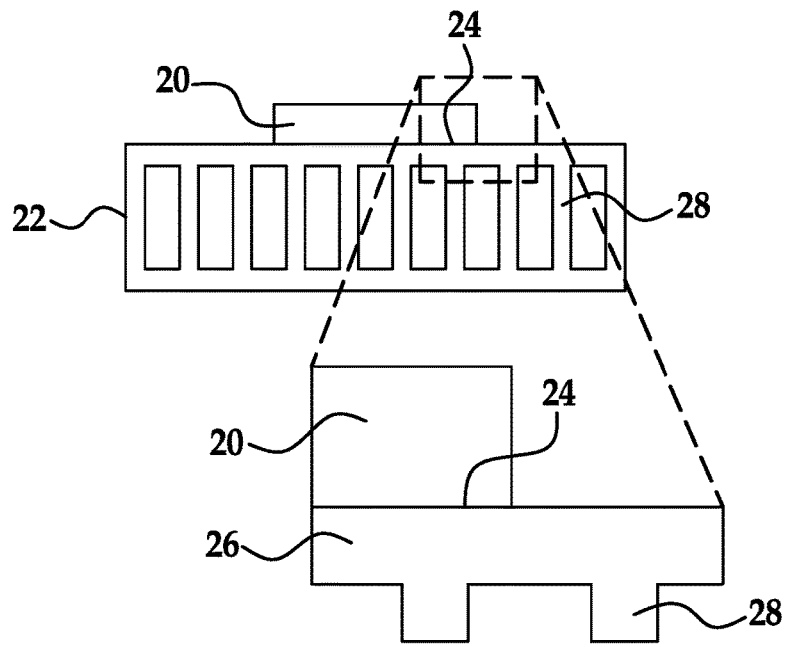
FIG. 1 is a schematic drawing showing a heat-dissipating surface and a manifold structure.

Referring first to FIG. 1, a schematic drawing of a heat-dissipating body or structure 20 and a cooling manifold structure 22 is shown. In an exemplary application, the heat-dissipating structure 20 may be a radar or other structure containing electronics to be cooled. The heat-dissipating structure 20 may have any suitable shape and the shape may be dependent on the application. The heat-dissipating structure 20 has at least one heat-dissipating surface 24 and may have a plurality of heat-dissipating surfaces. The heat-dissipating surface 24 may be located on an exterior area or portion of the heat-dissipating structure 20. The manifold structure 22 may be in the form of a frame member having a plurality of connected walls.

The manifold structure 22 has at least one attachment surface 26 located on a wall of the manifold structure 22. The attachment surface 26 is arranged adjacent the heat-dissipating surface 24 and extends along a length of the heat-dissipating surface 24. The attachment surface 26 may contact the heat-dissipating surface 24 such that the heat-dissipating surface 24 and the attachment surface 26 have a thermal interface therebetween. The attachment surface 26 may be attached to the heat-dissipating surface 24 using any suitable attachment method. The attachment surface 26 may extend along a portion of the entire length of the heat-dissipating surface 24 or the attachment surface 26 may extend along the entire length of the heat-dissipating surface 24.

The manifold structure 22 may include fins 28 that are arranged to extend along a length of the manifold structure 22. The frame member of the manifold structure 22 may include metal separator plates, and the fins 28 may extend between the plates. The fins 28 may extend along a length of the manifold structure 22 that is greater than the length of the heat-dissipating surface 24, as shown in FIG. 1. The fins 28 may extend generally perpendicular to the attachment surface 26. Using the fins 28 is advantageous in providing more efficient heat transfer through the manifold structure 22 by way of thermal conductivity from the thermal interface located between the heat-dissipating surface 24 and the attachment surface 26 to the fins 28, and by way of convection across the fins 28. The heat transfer $q_1$ from the thermal interface to the fins may be determined using equation (1).

$$q_1 = kA_1 \frac{\Delta T_1}{L_1} \qquad (1)$$

In equation (1), the heat transfer $q_1$ by conduction is determined using the thermal conductivity k of the material of the wall of the manifold structure 22, the surface area $A_1$ of the wall, the thickness $L_1$ of the wall, and the change in temperature $\Delta T_1$. The heat transfer $q_2$ from the fins to the air or coolant may be determined using equation (2).

$$q_2 = hA_2(\Delta T_2) \qquad (2)$$

In equation (2), the heat transfer $q_2$ by convection is determined using the convection coefficient h of the fins, the area $A_2$ of the fin walls, and the change in temperature $\Delta T_2$.

Figure 2:
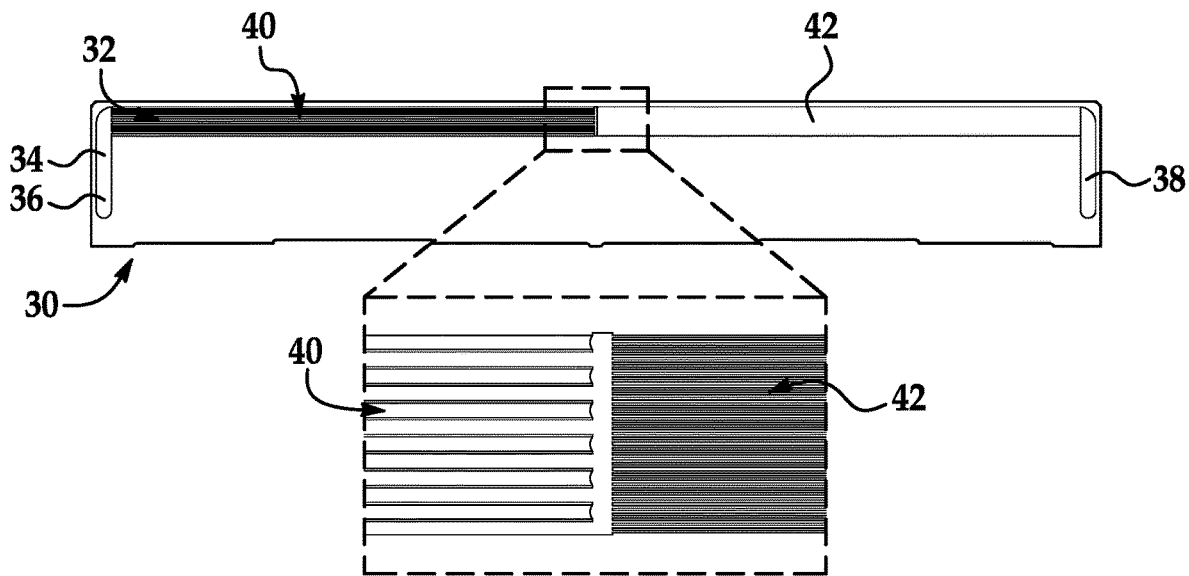
FIG. 2 is a schematic drawing showing a manifold structure having a plurality of fins arranged in a cooling channel of the manifold structure.

As shown in FIG. 2, an exemplary cooling manifold structure 30 is shown. The manifold structure 30 may be a portion of a larger manifold structure. The manifold structure 30 is configured to reduce a temperature gradient along the length of the heat-dissipating surface 24 (shown in FIG. 1). The manifold structure 30 may have a length that is greater than the height and the width of the manifold structure 30. The manifold structure 30 may have any suitable dimensions and the length, the height, and the width of the manifold structure may be dependent on the application. The manifold structure 30 includes at least one flow passage and may include a plurality of flow passages.

The manifold structure 30 includes a plurality of fins 32. The fins 32 of the manifold structure 30 may be preformed within a brazed cooling channel 34 of the manifold structure 30. The cooling channel 34 has an inlet fluid passage 36 and an outlet fluid passage 38, and the cooling channel 34 extends along the length of the manifold structure 30 from the inlet fluid passage 36 to the outlet fluid passage 38. The cooling channel 34 supplies cooling flow along the length of the heat-dissipating surface. The cooling channel 34 may have any suitable shape. For example, the cooling channel 34 may be serpentine in shape. The cooling channel 34 may also be arranged within an area where the heat-dissipating surface 24 (shown in FIG. 1) is located. For example, the cooling channel 34 may be an internal fluid passage that is arranged in the space where the electronics are located or external to the space to be cooled and in a separate manifold structure.

The manifold structure 30 includes a first set of fins 40 and a second set of fins 42 adjacent the first set of fins 40. The first set of fins 40 are arranged along a first half of the cooling channel 34 proximate the inlet fluid passage 36 and the second set of fins 42 are arranged along a second half of the cooling channel 34 proximate the outlet fluid passage 38. The first set of fins 40 and the second set of fins 42 each have a different predetermined spacing between the fins. For example, the first set of fins 40 includes coarser and less densely spaced fins, and the second set of fins 42 includes finer and more densely spaced fins. The coarser fins of the first set of fins 40 provide a lower pressure drop and lower heat transfer such that the fins have a higher temperature change between the cooling fluid and the surface temperature of the electronics. The finer fins of the second set of fins 42 provide a higher pressure drop and higher heat transfer such that the fins have a lower temperature change between the cooling fluid and the surface temperature of the electronics.

Figure 3:
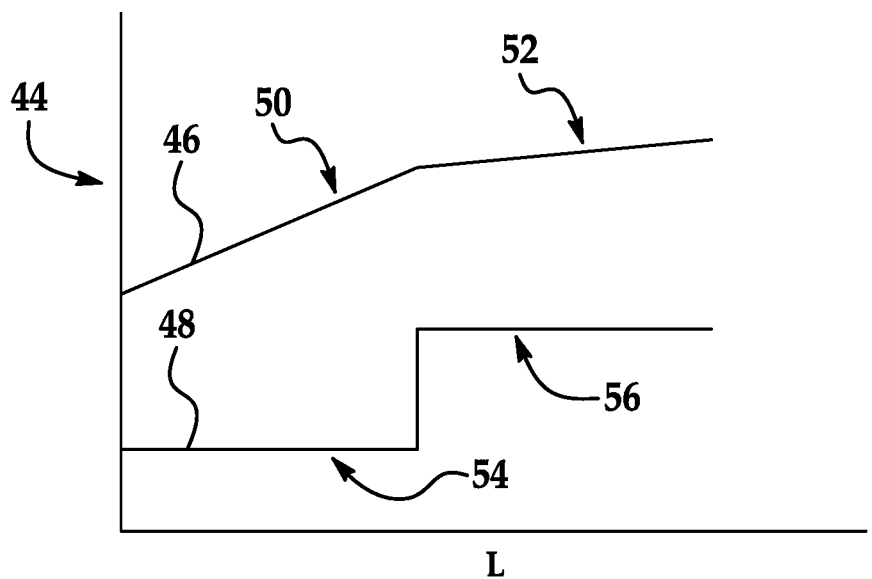
FIG. 3 is a graph showing the surface temperature of the heat-dissipating surface and the heat transfer between radiating element of the heat-dissipating surface across the length of the heat-dissipating surface.

Referring to FIG. 3, a graph 44 shows the surface temperature 46 of the heat-dissipating surface and the heat transfer 48 between radiating elements of the heat-dissipating surface across the length L of the heat-dissipating surface. The length L may correspond to the length from the inlet fluid passage (shown in FIG. 2) A first portion 50 of the length L corresponds to the coarser first set of fins 40 (shown in FIG. 2) and a second portion 52 of the length L corresponds to the finer second set of fins 42 (shown in FIG. 2). As shown in FIG. 3, the surface temperature 46 of the heat-dissipating surface increases at a steeper rate along the first portion 50 as compared with the second portion 52. As also shown in FIG. 3, the heat transfer 48 between the radiating elements of the heat-dissipating surface is lower along the first portion 50 as compared with the second portion 52. Using the finer fins increases the convection coefficient of the fins such that the heat transfer is increased and the temperature rise is reduced.

Figure 4:
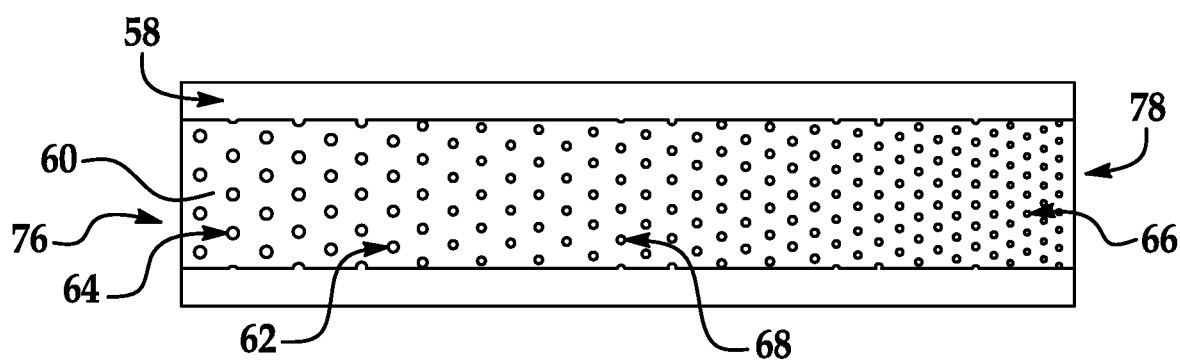
FIG. 4 is a schematic drawing showing a second embodiment of the manifold structure having a plurality of fins.
Figure 5:
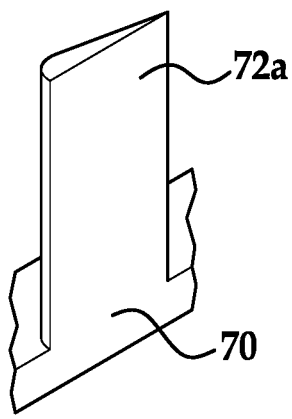
FIG. 5 is an oblique view of a fin having an elliptical shape and being straight relative to the heat-dissipating surface.

Referring to FIGS. 4 and 5, exemplary embodiments of cooling manifold structures including additively manufactured fins are shown. FIG. 4 shows a manifold structure 58 having a cooling channel 60. The cooling channel 60 includes a plurality of fins 62 arranged along the length of the cooling channel 60. The fins 62 are configured to provide a gradual gradient heat transfer across the length of the heat-dissipating surface. Thus, the manifold structure 58 provides a substantially linear heat transfer rate across the length of the heat-dissipating surface. Using an additive manufacturing (AM) process to form the fins 62 or other parts of the manifold structure 58 is advantageous due to the capabilities of AM in producing structures having complex structural features and material features. The structural features include the geometry of the fins, such as the shape and size, and the arrangement of the fins. Using AM to build up the fins 62 allows the fins 62 to be arranged in a direction normal to the direction of fluid flow through the cooling channel 60. The fins 62 may also be oriented in a direction normal to the heat-dissipating surface. AM also enables fins having different structures to be arranged in the same cooling channel.

The plurality of fins 62 may include a first set of fins 64 proximate the inlet fluid passage, a second set of fins 66 proximate the outlet fluid passage, and a third set of fins 68 arranged between the first set of fins 64 and the second set of fins 66. The first set of fins 64 includes fins having a first geometry or arrangement and the second set of fins 66 includes fins having a second geometry or arrangement. The third set of fins 68 includes fins having non-uniform and varying geometries relative to each other such that the third set of fins 68 is configured to provide a gradual geometry transition area between the first set of fins 64 and the second set of fins 66. For example, the first set of fins 64 may have a predetermined first spacing between the fins and the second set of fins 66 may have a predetermined second spacing between the fins. The spacing between each of the fins may gradually decrease, such as in even and predetermined increments, along the length of the cooling channel 60 from the inlet fluid passage to the outlet fluid passage, as shown in FIG. 4 such that the density of the fins gradually or incrementally increases. Thus, the third set of fins 64 may include adjacent subsets of fins having different spacings therebetween. The spacing between the fins in each subset may decrease at a constant and a substantially linear rate.

Figure 6:
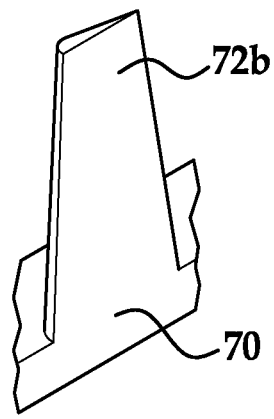
FIG. 6 is an oblique view of a fin having an elliptical shape and being tapered from the heat-dissipating surface.
Figure 7:
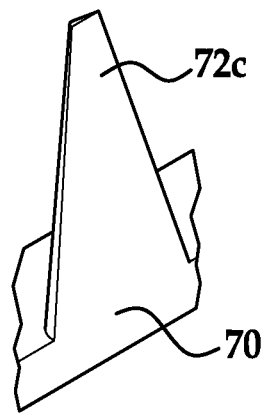
FIG. 7 is an oblique view of a fin having an elliptical shape and being more tapered than the fin in FIG. 6.
Figure 8:
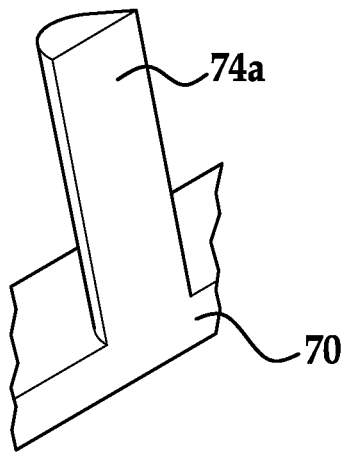
FIG. 8 is an oblique view of a fin having a cylindrical shape and being swept relative to the heat-dissipating surface.
Figure 9:
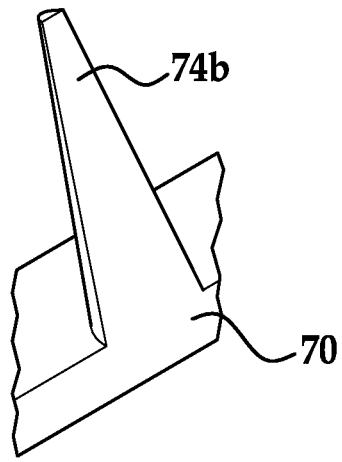
FIG. 9 is an oblique view of a fin having a cylindrical shape and being both swept and tapered relative to the heat-dissipating surface.

With further reference to FIGS. 5-9, each of the fins 62 may also be pin-shaped, such that the fins 62 may each have a body that extends from a surface 70 of the manifold structure 58. The body may extend in a direction that is normal to a flow of fluid through the cooling channel in which the fins are arranged. The body may have any suitable shape and many shapes may be suitable. For example, the body may have a shape that is cylindrical, elliptical, airfoil, or rectangular. FIGS. 5-7 show the body 72a, 72b, 72c having an elliptical shape. FIGS. 8 and 9 show the body 74a, 74b having a cylindrical or semi-cylindrical shape. The body may also have a shape that is tapered or swept or tapered and swept. For example, the body 72b of FIG. 6, the body 72c of FIG. 7, and the body 74b of FIG. 9 are tapered toward a top portion of the respective body. The body 74a of FIG. 8 and the body 74b of FIG. 9 are swept.

Using fins having a swept, tapered, or swept and tapered body may be advantageous in enabling fluid flow through the cooling channel in which the fins are arranged. The body may also be straight relative to the surface 70 of the manifold structure 58, as shown by the body 72a in FIG. 5, the body 72b in FIG. 6, and the body 72c in FIG. 7. Many different combinations of body shapes may be suitable. Different fins 62 located within the same cooling channel may also have varying or random shapes or all of the fins 62 may have the same shape. The shapes of the fins 62 in the cooling channel 60 may change in an ordered pattern such that the first set of fins 64 (shown in FIG. 4) may have a first predetermined shape, the second set of fins 66 (shown in FIG. 4) may have a second predetermined shape, and the third set of fins 68 may have varying shapes such that the fins 62 gradually transition from the first predetermined shape to the second predetermined shape, such that the manifold structure 58 has a substantially linear heat transfer rate.

The fins 62 may also have the same or different sizes throughout the cooling channel. The fins 62 may have the same shape or different shapes, and different sizes. The sizing of the fins 62 may be random or the sizing may gradually change along the length of the cooling channel. As best shown in FIG. 4, each of the fins 62 may have a cylindrical body. The first set of fins 64 may have a first diameter and the second set of fins 66 may have a second diameter. The second diameter may be smaller than the first diameter and the diameter of the fins may gradually decrease from the inlet fluid passage side 76 of the cooling channel 60 toward the outlet fluid passage side 78 of the cooling channel 60. The third set of fins 68 may include fins having various diameters to provide a gradual change in the fin diameters from the first diameter to the second diameter.

Figure 10:
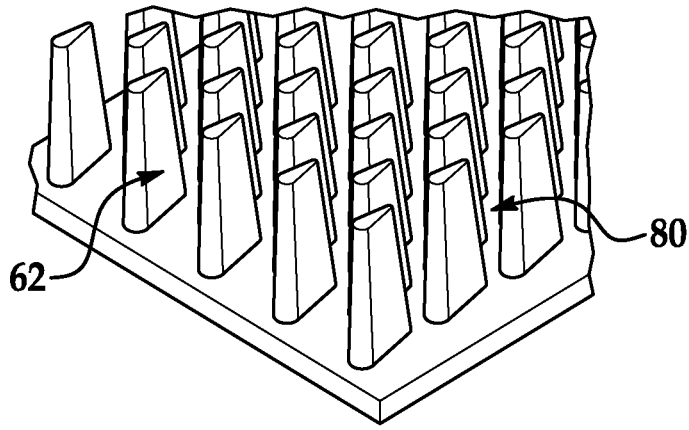
FIG. 10 is an oblique view of an array of elliptically-shaped fins.
Figure 11:
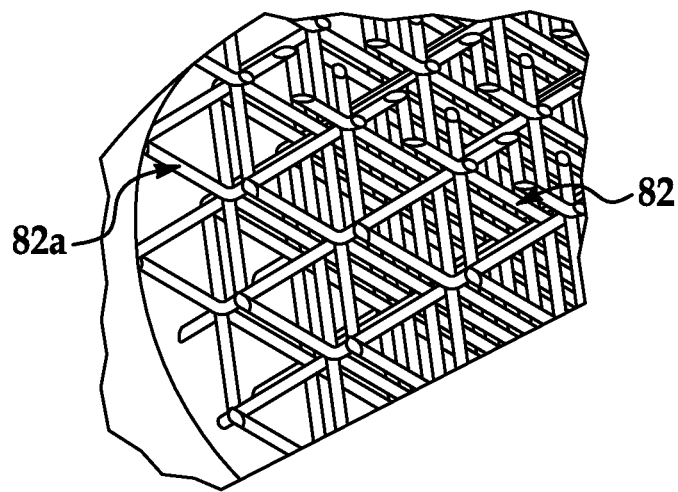
FIG. 11 is an oblique view of a lattice.

With further reference to FIGS. 10 and 11, the fins 62 may also be arranged in any suitable arrangement. As shown in FIG. 10, the fins 62 may be arranged in an ordered pattern, such as in an array 80. As shown in FIG. 11, the manifold structure may include a lattice arrangement 82 of additively manufactured bodies 82a that are connected to each other. The bodies 82a may be cylindrical or pin-shaped. The fins 62 or additively manufactured bodies 82a may also be arranged in a helical arrangement. The fins 62 may also be arranged randomly. Flow rate through the cooling channel may be dependent on the arrangement and the shape of the fins. For example, a lattice arrangement of fins may enable a higher flow rate through the cooling channel as compared with an array of fins having an elliptical shape. In another example, arranging the fins straight or normal to the heat-dissipating surface provides a more direct heat transfer path through the manifold structure.

Figure 12:
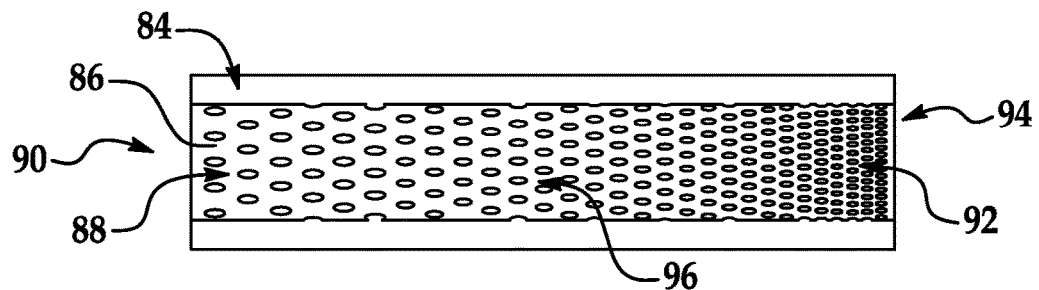
FIG. 12 is a schematic drawing showing a third embodiment of the manifold structure having a plurality of fins.

Referring now to FIG. 12, another exemplary cooling manifold structure 84 having fins with both varying geometries and different material properties is shown. The manifold structure 84 has a cooling channel 86, a first set of fins 88 arranged at an inlet fluid passage side 90 of the cooling channel 86, a second set of fins 92 arranged at an outlet fluid passage side 94 of the cooling channel 86, and a third set of fins 96 that are arranged between the first set of fins 88 and the second set of fins 92. The third set of fins 96 provides a geometry transition area and a material transition area from the first set of fins 88 toward the second set of fins 92. As shown in FIG. 12, the size of the fins and the spacing between the fins decreases from the inlet fluid passage side 90 toward the outlet fluid passage side 94.

Additionally, the fins may be formed of the same material or varying material across the length of the cooling channel 86. Any material suitable for AM may be used. Various metals may be suitable, such as aluminum and copper. Metal alloys may also be suitable. Suitable alloy materials include Inconel and stainless steel. Other suitable materials for the fins include non-conductive fibers or non-conductive metals. In an exemplary embodiment, the first set of fins 88 may be formed of aluminum and the second set of fins 92 may be formed of copper. The third set of fins 96 may be formed of aluminum or copper, or the fins may be formed of an aluminum and copper alloy such that the third set of fins 96 provides a gradual material transition area from the first set of fins 88 toward the second set of fins 92.

Figure 13:
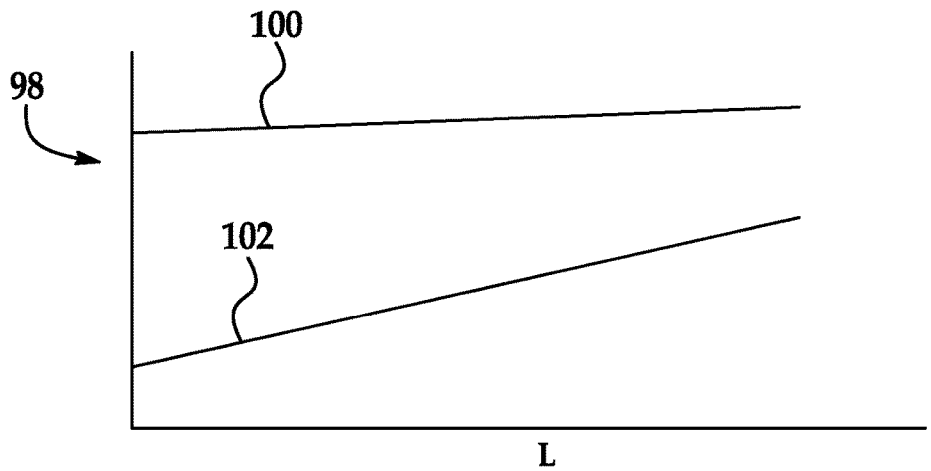
FIG. 13 is a graph showing the surface temperature of the heat-dissipating surface and the heat transfer between radiating element of the heat-dissipating surface across the length of the heat-dissipating surface using a manifold structure having additively manufactured fins.

With reference to FIG. 1 as described above and with further reference to FIG. 13, using the transition between materials creates a gradient thermal conductivity along the length of the cooling channel 86 and thus, a substantially linear heat transfer rate along the length of the cooling channel 86. FIG. 13 is a graph 98 that shows the surface temperature 100 of the heat-dissipating surface and the heat transfer 102 between radiating elements of the heat-dissipating surface across the length L of the heat-dissipating surface using a manifold structure having fins with both a geometry transition area and a material transition area.

With reference to the conduction heat transfer equation (1) above, the materials may be selected to vary the thermal conductivity k and create a gradient heat transfer $q_1$. Using the transition between geometries creates a gradient convection coefficient along the length of the cooling channel 86. With reference to the convection heat transfer equation (2) above, the geometry of the fins may be selected to vary the convection coefficient h of the fins and create a gradient heat transfer $q_2$. Thus, using both a geometry transition area and material transition area changes both the convection coefficient and the conductivity across the length of the cooling channel. Using the transition area is advantageous in creating a low temperature rise across the length of the cooling channel 86 and across the length L of the corresponding heat-dissipating surface to be cooled, as shown in FIG. 13. The manifold structure may be configured to have a geometry transition, a material transition, or both a geometry transition and a material transition.

Figure 14:
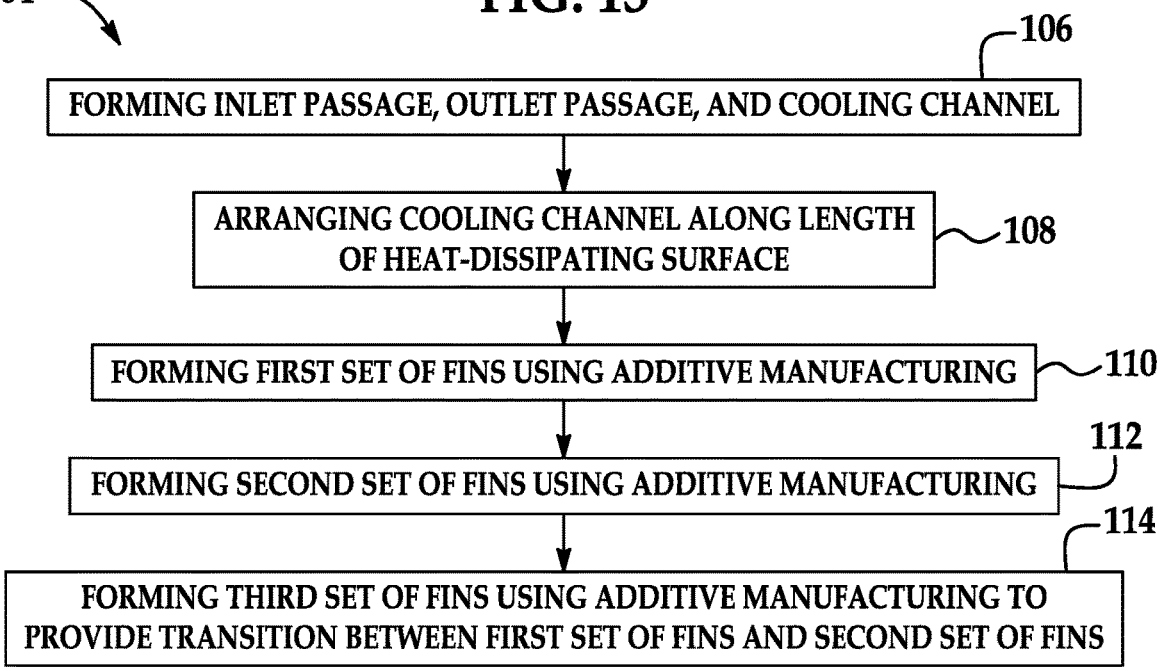
FIG. 14 is a chart showing a method of forming the manifold structure shown in FIG. 4 or 12.

Referring now to FIG. 14, a method 104 of forming the manifold structure 22 (shown in FIG. 1) for cooling the heat-dissipating surface 24 (shown in FIG. 1) is shown. Step 106 of the method 104 includes forming the inlet fluid passage 36 (shown in FIG. 2), the outlet fluid passage 38 (shown in FIG. 2), and a cooling channel 34 (shown in FIG. 2) that is connected between the inlet fluid passage 36 and the outlet fluid passage 38. Step 108 includes arranging the cooling channel 34 to extend along a length of the heat-dissipating surface 24 and forming a plurality of fins 62 (shown in FIG. 4) in the cooling channel 34 using an AM process. Step 110 includes forming a first set of fins 64 (shown in FIG. 4) proximate the inlet fluid passage side 76 (shown in FIG. 4). The first set of fins 64 may have at least one of a first predetermined, shape, size, and material composition. Step 112 includes forming a second set of fins 66 (shown in FIG. 4) proximate the outlet fluid passage side 78 (shown in FIG. 4). The fins 66 may have at least one of a second predetermined shape, size, and material composition. Step 114 includes forming a third set of fins 68 (shown in FIG. 4) that provide a transition area between the first set of fins 64 and the second set of fins 66 such that the fins provide gradient heat transfer across the length of the heat-dissipating surface 24.

Forming the plurality of fins 64, 66, 68 may include forming the plurality of fins to have uniform or non-uniform shapes that are one of or any combination of cylindrical, elliptical, rectangular, swept or tapered. Forming the plurality of fins may include forming the plurality of fins 64, 66, 68 in in a random arrangement or an ordered arrangement, such as in a helical arrangement, a lattice arrangement, or in an array. Forming the plurality of fins 64, 66, 68 may include gradually decreasing the spacing between each of the plurality of fins along the length of the heat-dissipating surface 24 from the inlet fluid passage 36 to the outlet fluid passage 38. The first set of fins 64 may be formed of a first material, the second set of fins 66 may be formed of a second material, and the third set of fins 68 may be formed of non-uniform materials to provide a gradual material transition area between the first set of fins 64 and the second set of fins 66. All of the sets of fins 64, 66, 68 may be formed of the same material.

Figure 15:
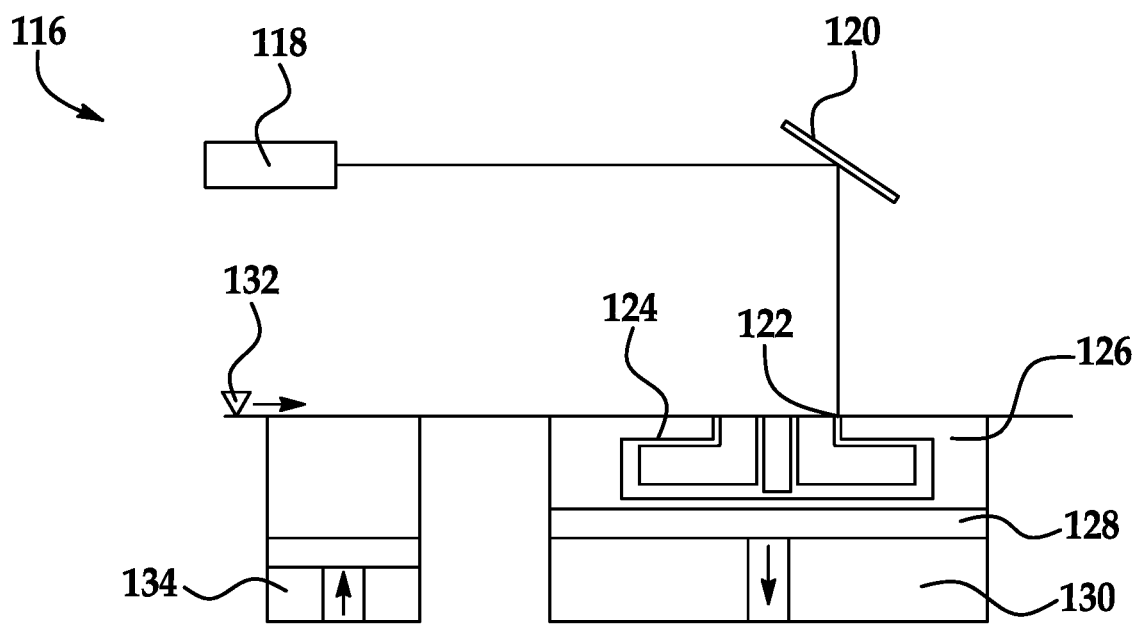
FIG. 15 is a schematic drawing showing a laser powder bed fusion process for forming the fins in the manifold structure.
Figure 16:
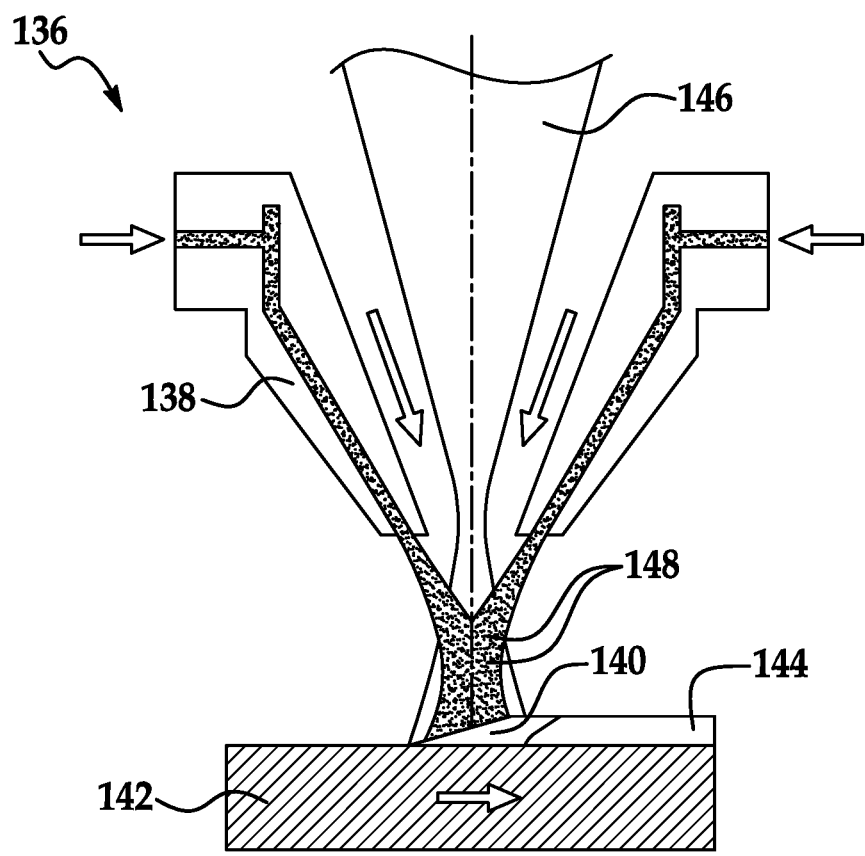
FIG. 16 is a schematic drawing showing a direct energy deposition process for forming the fins in the manifold structure.

Referring in addition to FIGS. 15 and 16, forming the plurality of fins may include using a laser powder bed fusion process or a direct energy deposition process. With reference to FIG. 15, a schematic drawing of a laser powder bed fusion process 116 is shown. The laser powder bed fusion process 16 includes using a laser or electron beam 118 and a tilted mirror 120 that directs the beam at the object 124 which is arranged in a powder bed 126. The powder bed 126 is arranged on a platform and retractable table 128 which is arranged above a space 130 for spreading the powder material over previous layers and building up the fin or fin layer. A roller or blade 132 is used for spreading the powder material and a hopper or reservoir and powder delivery system 134 is provided to supply fresh material for the blade 132.

With reference to FIG. 16, a schematic drawing of a direct energy deposition process 136 is shown. The directed energy deposition process 136 includes using a mounted nozzle 138 that deposits melted material 140 onto a surface 142 to form a welded track 144. The material is melted upon deposition using a laser or electron beam 146. The material is supplied using a delivery system 148 such as a powder jet. In addition to laser powder bed fusion and direct energy deposition, any suitable AM process may be used to form the plurality of fins in the cooling channel of the manifold structure. Another suitable AM process may include cold spraying, such that no laser is used to melt the material and less heat is used. Using AM is particularly advantageous in forming gradient convection coefficient and gradient conductivity structures due to AM being suitable for forming fins having complex structures and material properties. AM may also enable both conventional fin structures and complex fin structures to be arranged in the same cooling channel.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A manifold structure for cooling a heat-dissipating surface, the manifold structure comprising:
an inlet fluid passage;
an outlet fluid passage;
at least one cooling channel that is connected between the inlet fluid passage and the outlet fluid passage and extends along a length of the heat-dissipating surface; and
a plurality of fins that is arranged within the at least one cooling channel, wherein the plurality of fins includes a geometry transition area in which the plurality of fins gradually transitions from a first geometry to a second geometry,
wherein the plurality of fins includes a first set of fins arranged proximate the inlet fluid passage, a second set of fins arranged proximate the outlet fluid passage, and a third set of fins arranged between the first set of fins and the second set of fins, wherein the first set of fins includes fins having the first geometry and the second set of fins includes fins having the second geometry, wherein the third set of fins includes fins having non-uniform and varying geometries relative to each other, the third set of fins being configured to provide the geometry transition area, whereby the plurality of fins is configured to provide a gradient convection coefficient across the length of the heat-dissipating surface.

2. The manifold structure of claim 1, wherein a spacing between each of the plurality of fins gradually decreases along the length of the heat-dissipating surface from the inlet fluid passage to the outlet fluid passage, whereby a density of the plurality of fins gradually increases.

3. The manifold structure of claim 2, wherein the spacing decreases at a constant and linear rate.

4. The manifold structure of claim 1, wherein the plurality of fins gradually increases or decreases in size along the length of the heat-dissipating surface.

5. The manifold structure of claim 1, wherein each of the plurality of fins is pin-shaped.

6. The manifold structure of claim 5, wherein the plurality of fins has diameters that increase or decrease along the length of the heat-dissipating surface.

7. The manifold structure of claim 1, wherein the first set of fins are formed of a first material, the second set of fins are formed of a second material, and the third set of fins are formed of non-uniform materials, wherein the third set of fins is configured to provide a material transition area, whereby the plurality of fins is configured to provide a gradient thermal conductivity across the length of the heat-dissipating surface.

8. The manifold structure of claim 7, wherein the first set of fins is formed of a first metal material and the second set of fins is formed of a second metal material.

9. The manifold structure of claim 8, wherein one of the first metal material and the second metal material is aluminum, the other of the first metal material and the second metal material is copper, and the third set of fins is formed of alloys of copper and aluminum.

10. A manifold structure for cooling a heat-dissipating surface, the manifold structure comprising:
an inlet fluid passage;
an outlet fluid passage;
at least one cooling channel that is connected between the inlet fluid passage and the outlet fluid passage and extends along a length of the heat-dissipating surface;
a first set of fins that is arranged proximate the inlet fluid passage within the at least one cooling channel, the first set of fins being formed of a first material;
a second set of fins that is arranged proximate the outlet fluid passage within the at least one cooling channel, the second set of fins being formed of a second material; and
a third set of fins that is arranged between the first set of fins and the second set of fins, the third set of fins being formed of a non-uniform material for providing a material transition area from the first set of fins to the second set of fins,
wherein the manifold structure is configured to provide a gradient thermal conductivity by way of the material transition area across the length of the heat-dissipating surface.

11. The manifold structure of claim 10, wherein a spacing between each of the plurality of fins gradually decreases along the length of the heat-dissipating surface from the inlet fluid passage to the outlet fluid passage, whereby a density of the plurality of fins gradually increases.

12. The manifold structure of claim 10, wherein the plurality of fins are pin-shaped and the plurality of fins have diameters that increase or decrease along the length of the heat-dissipating surface.

13. The manifold structure of claim 10, wherein one of the first material and the second material is aluminum, the other of the first material and the second material is copper, and the third set of fins is formed of alloys of copper and aluminum.

14. A method of forming the manifold structure of claim 1 for cooling the heat-dissipating surface, the method comprising
forming the plurality of fins in the at least one cooling channel using an additive manufacturing process.

15. The method of claim 14, wherein forming the plurality of fins includes using a laser powder bed fusion process or a direct energy deposition process.

16. The method of claim 14, wherein forming the plurality of fins includes forming the plurality of fins in an ordered arrangement.

17. The method of claim 14, wherein forming the plurality of fins includes gradually decreasing the spacing between each of the plurality of fins along the length of the heat-dissipating surface from the inlet fluid passage to the outlet fluid passage.

18. The method of claim 14, wherein forming the plurality of fins includes:
forming the first set of fins of a first material;
forming the second set of fins of a second material; and
forming the third set of fins of non-uniform materials, the third set of fins being configured to provide a gradual material transition between the first set of fins and the second set of fins, whereby the plurality of fins is configured to provide the gradient thermal conductivity across the length of the heat-dissipating surface.

19. A manifold structure for cooling a heat-dissipating surface, the manifold structure comprising:
an inlet fluid passage;
an outlet fluid passage;
at least one cooling channel that is connected between the inlet fluid passage and the outlet fluid passage and extends along a length of the heat-dissipating surface; and
a plurality of fins that is arranged within the at least one cooling channel, wherein the plurality of fins includes at least one of:
  a geometry transition area in which the plurality of fins gradually transitions from a first geometry to a second geometry; or
  a material transition area in which the plurality of fins gradually transitions from a first material to a second material,
wherein the plurality of fins is configured to provide at least one of a gradient convection coefficient or a gradient thermal conductivity across the length of the heat-dissipating surface, and
wherein a spacing between each of the plurality of fins gradually decreases along the length of the heat-dissipating surface from the inlet fluid passage to the outlet fluid passage, whereby a density of the plurality of fins gradually increases.

20. A method of forming the manifold structure of claim 10 for cooling the heat-dissipating surface, the method comprising forming the plurality of fins in the at least one cooling channel using an additive manufacturing process.

* * * * *